United States Patent
Yao et al.

(10) Patent No.: US 9,487,867 B2
(45) Date of Patent: Nov. 8, 2016

(54) METHOD FOR PREPARING A FILM AND METHOD FOR PREPARING AN ARRAY SUBSTRATE, AND ARRAY SUBSTRATE

(71) Applicant: BOE TECHNOLOGY GROUP CO., LTD., Beijing (CN)

(72) Inventors: Qi Yao, Beijing (CN); Feng Zhang, Beijing (CN); Zhanfeng Cao, Beijing (CN); Zhengliang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/495,409

(22) Filed: Sep. 24, 2014

(65) Prior Publication Data

US 2015/0364327 A1 Dec. 17, 2015

(30) Foreign Application Priority Data

Jun. 11, 2014 (CN) .......................... 2014 1 0258172

(51) Int. Cl.
   *C23C 30/00* (2006.01)
   *H01L 29/786* (2006.01)
   *C23C 8/12* (2006.01)
   *H01L 21/28* (2006.01)

(52) U.S. Cl.
   CPC .................. *C23C 30/00* (2013.01); *C23C 8/12* (2013.01); *H01L 21/28008* (2013.01); *H01L 29/786* (2013.01)

(58) Field of Classification Search
   None
   See application file for complete search history.

(56) References Cited

U.S. PATENT DOCUMENTS

2004/0224183 A1* 11/2004 Nakamata ........... H01L 51/5092
                                                      428/690
2011/0233550 A1*  9/2011 Takasawa et al. ... C23C 14/0036
                                                      257/57

FOREIGN PATENT DOCUMENTS

| CN | 101529566 A  | 9/2009  |
| CN | 101778962 A  | 7/2010  |
| CN | 102165596 A  | 8/2011  |
| CN | 102804341 A  | 11/2012 |
| JP | 2009043797 A | 2/2009  |

OTHER PUBLICATIONS

First Office Action of the Chinese application No. 201410258172.9, dated May 3, 2016. Translation provided by Dragon Intellectual Property Law Firm.

* cited by examiner

*Primary Examiner* — Michelle Mandala
(74) *Attorney, Agent, or Firm* — Harness, Dickey & Pierce, P.L.C.

(57) ABSTRACT

The present invention discloses a method for preparing a film and a method for preparing an array substrate, and an array substrate. The method for preparing a film comprises forming an AB alloy film subjected to oxidation treatment and forming a first metal A film, wherein the first metal A film is provided to contact with the AB alloy film subjected to oxidation treatment, wherein A is a first metal and B is a second metal, the second metal is selected from active metals in period 2 to period 4 of group 2, and the AB alloy film subjected to oxidation treatment is formed by forming an alloy film of a first metal A and a second metal B in the presence of an oxygen-containing gas.

15 Claims, 2 Drawing Sheets

US 9,487,867 B2

METHOD FOR PREPARING A FILM AND METHOD FOR PREPARING AN ARRAY SUBSTRATE, AND ARRAY SUBSTRATE

CROSS-REFERENCE TO RELATED APPLICATION

This application claims priority to Chinese Patent Application No. 201410258172.9 filed on Jun. 11, 2014, the disclosures of which are incorporated in their entirety by reference herein.

TECHNICAL FIELD

The present invention relates to the field of film preparation technologies, in particular to a method for preparing a film and a method for preparing an array substrate, and an array substrate.

BACKGROUND

In the field of display, with the increasing popularization of large-size and high-driving frequency products, low-resistance copper (Cu) wiring technology attracts more and more attention. But, Cu film has a problem of poor adhesion force with glass and semiconductor layers, thus a metal layer having a good adhesion force to glass and semiconductor layers is required as a buffer layer before manufacturing a Cu wiring.

All panel manufacturers have developed the Cu technology, and Ti or MoTi is initially used as a buffer material. As research on the Cu material continues, Mo and molybdenum alloy materials such as MoW and MoTa are developed and applied to the manufacturing of Cu wiring. However, these two generations of buffer layers have a common problem that it was easy to cause the problem of chamfer or residue during the etching process of a Cu film, because the corrosion potentials of Cu alloy and Mo alloy are different.

SUMMARY

The technical problem solved by the present invention is to provide a buffer layer with a good performance, for a metal film with a poor adhesive force.

In order to solve the above technical problem, the invention provides a method for preparing a film, comprising:

forming an AB alloy film subjected to oxidation treatment, wherein A is a first metal and B is a second metal, the second metal is selected from active metals in period 2 to period 4 of group 2, and the AB alloy film subjected to oxidation treatment is formed by forming an alloy film of a first metal A and a second metal B in the presence of an oxygen-containing gas, forming a first metal A film, wherein the first metal A film is provided to contact with the AB alloy film subjected to oxidation treatment.

In the above method, the second metal B is calcium or magnesium.

In the above method, molar content of the second metal B is 1%~10% in an alloy of the first metal A and the second metal B.

In the above method, the first metal A is copper.

In the above method, the oxygen-containing gas comprises oxygen and argon, wherein volume flow rate ratio of the oxygen to the argon is 1:30~1:3.

In the above method, the alloy film of a first metal A and a second metal B is formed in the presence of an oxygen-containing gas at a temperature of 80° C.~250° C.

The invention further provides a method for preparing an array substrate, comprising:

forming an AB alloy film subjected to oxidation treatment, wherein A is a first metal and B is a second metal, the second metal is selected from active metals in period 2 to period 4 of group 2, and the AB alloy film subjected to oxidation treatment is formed by forming an alloy film of a first metal A and a second metal B in the presence of an oxygen-containing gas, forming a first metal A film, wherein the first metal A film is provided to contact with the AB alloy film subjected to oxidation treatment.

In the above method, the first metal A film comprises a gate metal film for forming a gate electrode and a source-drain metal film for forming a source electrode and a drain electrode.

The invention further provide an array substrate, comprising a pattern of a first metal A film and a pattern of an AB alloy film subjected to oxidation treatment, wherein the pattern of a first metal A film and the pattern of an AB alloy film subjected to oxidation treatment have positional correspondence and are provided to contact with each other.

In the above array substrate, the second metal B is calcium or magnesium.

In the above array substrate, the first metal A is copper.

In the above array substrate, the first metal A film comprises a gate metal film for forming a gate electrode and a source-drain metal film for forming a source electrode and a drain electrode.

The above technical solutions of the invention have the following beneficial effects.

In the above technical solutions, an AB alloy film subjected to oxidation treatment is first formed before forming the first metal A film with a poor adhesive force. The AB alloy film subjected to oxidation treatment is formed by forming an alloy film of a first metal A and a second metal B in the presence of an oxygen-containing gas. The second metal B is selected from active metals in period 2 to period 4 of group 2, which is easily oxidized to form a compact alloy oxide having a good adhesive force by combining with oxygen, thereby greatly improving the adhesive force of the first metal A. At the same time, because the AB alloy film subjected to oxidation treatment contains the first metal A, the corrosion potential of the first metal A film is the same as that of the AB alloy film subjected to oxidation treatment, so that the problem of chamfer or residue or the like caused by corrosion potentials will be eliminated during the etching process.

BRIEF DESCRIPTION OF THE DRAWINGS

In order to more clearly illustrate the technical solutions of the embodiments of the invention or the prior art, the drawings required in the description of the embodiments or the prior art will be briefly introduced below. Apparently, the drawings in the description below only show some embodiments of the invention, and other drawings may also be obtained by one of ordinary skills in the art based on these drawings without creative work.

DETAILED DESCRIPTION

The specific embodiment of the invention will be further described in detail below in conjunction with the drawings and example. The following examples are used for illustrating the invention, rather than limiting the scope of the invention.

EXAMPLE 1

Figure 1:
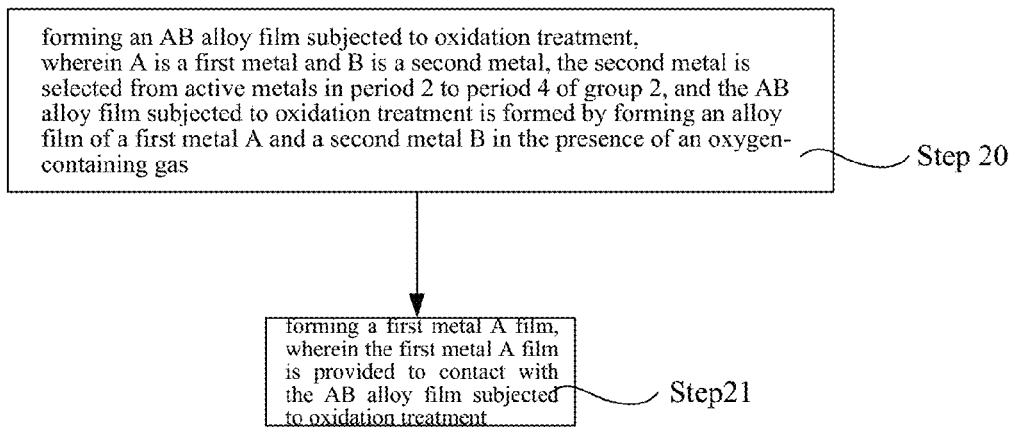
FIG. 1 is a flow chart showing the process of preparing a metal film according to one embodiment of the invention

As shown in FIG. 1, the invention provides a method for preparing a film, which includes a step 21 of forming a first metal A film. Wherein, the first metal A is a metal with a poor adhesive force, for example, metal copper Cu. Specifically, on an array substrate, for a wiring formed of the first metal A, for example, a gate line, a data line, a gate electrode, a source electrode and a drain electrode, there exists a problem that adhesive force between a base substrate and a semiconductor layer is poor.

In order to solve the above technical problem, before the step 21 of forming a first metal A film, the invention further comprises:

a step 20 of forming an AB alloy film subjected to oxidation treatment, which is provided to contact with the first metal A film, wherein A is first metal and B is a second metal, the second metal is selected from active metals in period 2 to period 4 of group 2, and the AB alloy film subjected to oxidation treatment is formed by forming an alloy film of a first metal A and a second metal B in the presence of an oxygen-containing gas.

Wherein, the process for forming the alloy film may be a process such as depositing, coating and printing, etc.

Specifically, in the array substrate, the AB alloy film subjected to oxidation treatment is provided between the first metal A film and the base substrate, or between the first metal A film and the semiconductor layer.

In the above technical solution, the AB alloy film subjected to oxidation treatment has a compact structure, and thus it has a good adhesive force, thereby greatly improving the adhesive force of the first metal A. At the same time, because the AB alloy film subjected to oxidation treatment contains the first metal A, the corrosion potential of the first metal A film is the same as that of the AB alloy film subjected to oxidation treatment, so that the problem of chamfer or residue or the like caused by corrosion potentials will be eliminated during the etching process.

Preferably, the second metal B is calcium or magnesium, which has lower activity than beryllium in period 2, thereby being capable of providing a stable performance for the alloy of the first metal A and the second metal B.

In the alloy of the first metal A and the second metal B, the second metal B content cannot be too high to affect the stability of the alloy because the second metal B is an active metal. Generally, molar content of the second metal B is 1%~10%, most preferably, 1%~3%.

Further, the oxygen-containing gas for forming the alloy oxide may be a gas that includes oxygen gas, water vapour or carbon dioxide. The temperature for oxidization is 80° C.~250° C. Specifically, the alloy film of a first metal A and a second metal B is formed in the presence of an oxygen-containing gas at a temperature of 80° C.~250° C.

In this example, Main gas in the oxygen-containing gas may be oxygen and argon. Oxygen content in the oxygen-containing gas should is within limits, because if the oxygen content is too high, it may cause peroxidation of the alloy. Wherein, the volume flow rate ratio of oxygen to argon is 1:30~1:3. Here, it is not limited to that the oxygen-containing gas contains only argon, instead, the oxygen-containing gas may contain other non-oxidizing gases or inert gases.

Figure 2A:
FIG. 2a is a sectional view showing a calcium-copper alloy film formed by directly depositing.
Figure 2B:
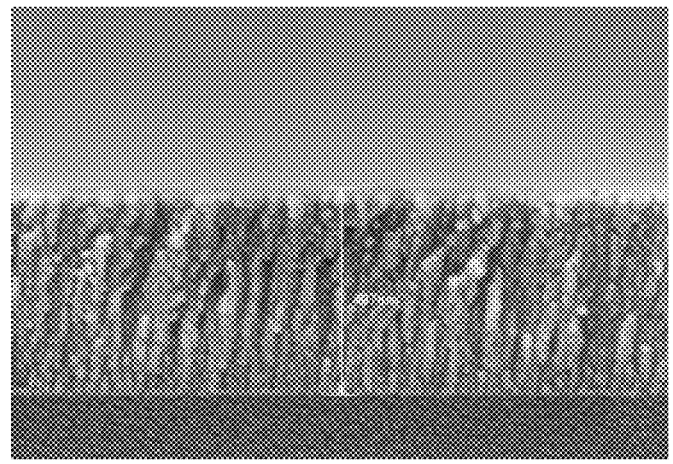
FIG. 2b is a sectional view showing a calcium-copper alloy oxide film prepared by the method according to one embodiment of the invention.

In one specific example, the first metal A is copper and the second metal B is calcium. The section of a film formed by directly depositing a CuCa alloy is as shown in FIG. 2a. The section of a CuCa alloy oxide film which is formed by the method according to the example of the invention, i.e., by depositing a CuCa alloy in the presence of an oxygen-containing gas at a temperature of 80° C.~250° C. is as shown in FIG. 2b. Apparently, the CuCa alloy oxide film formed by the method according to the example of the invention has the compact structure, and thus has the good adhesive force.

EXAMPLE 2

The invention further provides a method for preparing an array substrate. Because the array substrate includes a first metal A wiring, the method includes a step of preparing a first metal A film, a step of patterning the first metal A film to forming a required metal wiring. For a thin-film transistor array substrate, the first metal A wiring includes a gate line, a data line, a gate electrode, a source electrode and a drain electrode.

Before the step of forming a first metal A film, the method further includes a step of forming an AB alloy film subjected to oxidation treatment, which is provided to contact with the first metal A film, wherein A is first metal and B is a second metal, the second metal is selected from active metals in period 2 to period 4 of group 2, and the AB alloy film subjected to oxidation treatment is formed by forming an alloy film of a first metal A and a second metal B in the presence of an oxygen-containing gas. The alloy oxide of the first metal A has a good adhesive force due to its compact structure, thereby greatly improving the first metal A. At the same time, because the AB alloy film subjected to oxidation treatment contains the first metal A, the corrosion potential of the first metal A film is the same as that of the AB alloy film subjected to oxidation treatment, so that the problem of chamfer or residue or the like caused by corrosion potentials will be eliminated during the etching process.

Specifically, for a thin-film transistor array substrate, the first metal A film comprises a gate metal film for forming a gate electrode and a gate line, a source-drain metal film for forming a data line, a source electrode and a drain electrode, an alloy oxide film for forming a gate metal before forming the gate metal film; and an alloy oxide film for forming the source-drain metal before forming the source-drain metal film. The gate metal and the source-drain metal are generally low-resistance metal copper Cu.

Figure 3:
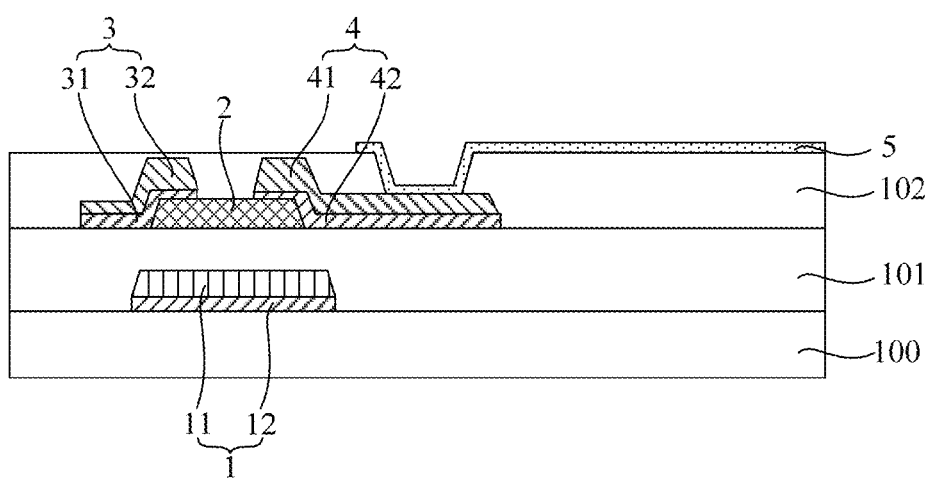
FIG. 3 a schematic diagram showing a partial structure of an array substrate according to one embodiment of the invention.

In conjunction with FIG. 3, for example, for a bottom-gate type thin-film transistor array substrate, the step of preparing a gate line and a gate electrode specifically comprises:

Step 50: depositing a Cu alloy film on a base substrate 100 in the presence of an oxygen-containing gas to form a Cu alloy oxide film, Step 51: forming a Cu film on the base substrate 100 undergoing the Step 50, Step 52: coating a photoresist on the base substrate 100 undergoing the Step 51 and exposing the photoresist to form a photoresist-reserved region and a photoresist-removed region, wherein the photoresist-reserved region corresponds to a region in which the gate electrode and the gate line exist and the photoresist-removed region corresponds to other regions. The Cu film and the Cu alloy oxide film in the photoresist-removed region are etched to form patterns of the gate line and the gate electrode. The remaining photoresist is peeled off to obtain a gate line (not shown) and a gate electrode 1. Wherein the gate electrode 1 includes a copper metal layer 11 and a copper alloy oxide layer 12.

After forming the gate line and the gate electrode 1, the method further comprises:

Step 53: forming a gate insulating layer 101 (an insulating layer of silicon dioxide, silicon nitride or silicon oxynitride, etc.) on the base substrate 100 undergoing the Step 52 and forming a semiconductor layer pattern 2 corresponding to the gate electrode 1 on the gate insulating layer 101.

The step of forming a data line, a source electrode and a drain electrode specifically comprises:

Step 54: depositing a Cu alloy film on a base substrate 100 undergoing Step 53 in the presence of an oxygen-containing gas to form a Cu alloy oxide film, Step 55: forming a Cu film on the base substrate 100 undergoing the Step 54, Step 56: forming a photoresist on the base substrate 100 undergoing the Step 55 and exposing the photoresist to form a photoresist-reserved region and a photoresist-removed region, wherein the photoresist-reserved region corresponds to the region in which the data line, the source electrode and the drain electrode exist, and the photoresist-removed region corresponds to other regions. The Cu film and the Cu alloy oxide film in the photoresist-removed region are etched to form patterns of the data line, the source electrode and the drain electrode. The remaining photoresist is peeled off to obtain a data line (not shown), a source electrode 3 and a drain electrode 4. Wherein, the source electrode 3 includes a copper metal layer 31 and a copper alloy oxide layer 32. The drain electrode 4 includes a copper metal layer 41 and a copper alloy oxide layer 42.

So far, the bottom-gate type thin-film transistor has been manufactured.

Then, a passivation layer 102 (an insulating layer of silicon dioxide, silicon nitride or silicon oxynitride, etc.) is formed on the base substrate 100 undergoing the Step 56.

Finally, a pixel electrode 5 is formed on the passivation layer 102. The pixel electrode 5 contacts and electrically connects with the drain electrode 4 through a via hole in the passivation layer.

Preferably, in this example, the second metal B is calcium or magnesium, which has lower activity than beryllium in period 2, thereby being capable of providing a stable performance for the alloy of the first metal A and the second metal B. The gate electrode 1 includes a copper metal layer 11 and a calcium-copper alloy oxide layer 12. Alternatively, the gate electrode 1 includes a copper metal layer 11 and a magnesium-copper alloy oxide layer 12. The source electrode 3 includes a copper metal layer 31 and a calcium-copper alloy oxide layer 32. Alternatively, the source electrode 3 includes a copper metal layer 31 and a magnesium-copper alloy oxide layer 32. The drain electrode 4 includes a copper metal layer 41 and a calcium-copper alloy oxide layer 42. Alternatively, drain electrode 4 includes a copper metal layer 41 and a magnesium-copper alloy oxide layer 42.

EXAMPLE 3

The invention further provides an array substrate, which comprises a pattern of a first metal A film. The array substrate further comprises a pattern of an AB alloy film subjected to oxidation treatment that corresponds to the pattern of the first metal A film and is provided to contact with the pattern of the first metal A film. Wherein B is a second metal, the second metal is selected from active metals in period 2 to period 4 of group 2, and the AB alloy film subjected to oxidation treatment is located between the first metal A film and a base substrate or between the first metal A film and a semiconductor layer.

The AB alloy film subjected to oxidation treatment has a good adhesive force due to its compact structure, thereby greatly improving the adhesive force of the first metal A. At the same time, because the AB alloy film subjected to oxidation treatment contains the first metal A, the corrosion potential of the first metal A film is the same as that of the AB alloy film subjected to oxidation treatment, so that the problem of chamfer or residue or the like caused by corrosion potentials will be eliminated during the etching process.

Specifically, the second metal B is calcium or magnesium, which has lower activity than beryllium in period 2, thereby being capable of providing a stable performance for the alloy of the first metal A and the second metal B.

Wherein, the first metal A film is used for the wiring of the array substrate. For a thin-film transistor array substrate, the wiring includes a gate line, a data line, a gate electrode, a source electrode and a drain electrode. In the prior art, in order to decrease transmission resistance, the first metal A is generally low-resistance copper Cu.

In one specific example, the gate electrode and the gate line of the thin-film transistor array substrate include a copper metal layer and a calcium-copper alloy oxide layer. Alternatively, the gate electrode and the gate line of the thin-film transistor array substrate include a copper metal layer and a magnesium-copper alloy oxide layer. The data line, the source electrode and the drain electrode include a copper metal layer and a calcium-copper alloy oxide layer. Alternatively, the data line, the source electrode and the drain electrode include a copper metal layer and magnesium-copper alloy oxide layer.

For a bottom-gate type thin-film transistor array substrate, it specifically comprises a base substrate 100, a gate electrode 1 and a gate line (not shown) formed on the base substrate 100, a gate insulating layer 101 formed on the gate electrode 1 and the gate line, a semiconductor layer pattern 2 formed on the gate insulating layer 101, a data line (not shown), a source electrode 3 and a drain electrode 4 formed on the semiconductor layer pattern 2, a passivation layer 102 formed on the data line, the source electrode 3 and the drain electrode 4; and a pixel electrode 5 formed on the passivation layer 102.

The base substrate 100 is a transparent substrate, for example, a glass substrate, a quartz substrate or an organic resin substrate. The gate electrode 1 includes a copper metal layer 11 and a calcium-copper alloy oxide layer 12. Alternatively, the gate electrode 1 includes a copper metal layer 11 and a magnesium-copper alloy oxide layer 12. The gate line also includes a copper metal layer and a calcium-copper alloy oxide layer, or a copper metal layer and magnesium-copper alloy oxide layer. The semiconductor layer pattern is silicon semiconductor or metal oxide semiconductor. The source electrode 3 includes a copper metal layer 31 and a calcium-copper alloy oxide layer 32. Alternatively, the source electrode 3 includes a copper metal layer 31 and a magnesium-copper alloy oxide layer 32. The drain electrode 4 includes a copper metal layer 41 and a calcium-copper alloy oxide layer 42. Alternatively, the drain electrode 4 includes a copper metal layer 41 and a magnesium-copper alloy oxide layer 42. The data line also includes a copper metal layer and a calcium-copper alloy oxide layer. Alternatively, the data line includes a copper metal layer and magnesium-copper alloy oxide layer. The pixel electrode 5 is electrically connected with the drain electrode 4 by a via hole in the passivation layer.

In the technical solution of the invention, for a first metal A film with a poor adhesive force, an AB alloy film subjected to oxidation treatment is first formed before forming the first metal A film. The AB alloy film subjected to oxidation treatment is formed by forming an alloy film of a first metal A and a second metal B in the presence of an oxygen-containing gas. The second metal B is selected from active metals in period 2 to period 4 of group 2, which is easily oxidized to form a compact alloy oxide having a good adhesive force by combining with oxygen, thereby greatly improving the adhesive force of the first metal A. At the same time, because the AB alloy film subjected to oxidation treatment contains the first metal A, the corrosion potential of the first metal A film is the same as that of the AB alloy film subjected to oxidation treatment, so that the problem of chamfer or residue or the like caused by corrosion potentials will be eliminated during the etching process.

The above description only shows some preferred implementations of the invention. It should be noted that, various improvements and substitutions may be made by one of ordinary skills in the art without departing from the technical principles of the invention. Therefore, all these improvements and substitutions should be construed as falling into the protection scope of the invention.

What is claimed is:

1. A method for preparing a film, comprising:
   forming an AB alloy film subjected to oxidation treatment,
   wherein the AB alloy film consists of A and B, where A is a first metal and B is a second metal, the second metal is beryllium, and the AB alloy film subjected to oxidation treatment is formed by forming an alloy film of the first metal A and the second metal B in the presence of an oxygen-containing gas,
   forming a first metal A film, wherein the first metal A film is provided to contact with the AB alloy film subjected to oxidation treatment.

2. The method according to claim 1, wherein the oxygen-containing gas comprises oxygen and argon, and volume flow rate ratio of the oxygen to the argon is 1:30~1:3.

3. The method according to claim 1, wherein the alloy film of a first metal A and a second metal B is formed in the presence of an oxygen-containing gas at a temperature of 80° C. ~250° C.

4. A method for preparing an array substrate, comprising forming an AB alloy film subjected to oxidation treatment,
   wherein the AB alloy film consists of A and B, where A is a first metal and B is a second metal, the second metal is beryllium, and the AB alloy film subjected to oxidation treatment is formed by forming an alloy film of the first metal A and the second metal B in the presence of an oxygen-containing gas,
   forming a first metal A film, wherein the first metal A film is provided to contact with the AB alloy film subjected to oxidation treatment.

5. The preparation method according to claim 4, wherein the first metal A film comprises a gate metal film for forming a gate electrode and a source-drain metal film for forming a source electrode and a drain electrode.

6. The preparation method according to claim 4, wherein the oxygen-containing gas comprises oxygen and argon, and volume flow rate ratio of the oxygen to the argon is 1:30~1:3.

7. The preparation method according to claim 4, wherein the alloy film of a first metal A and a second metal B is formed in the presence of an oxygen-containing gas at a temperature of 80° C. ~250° C.

8. An array substrate, comprising a pattern of a first metal A film and a pattern of an AB alloy film subjected to oxidation treatment, wherein the pattern of the first metal A film and the pattern of the AB alloy film subjected to oxidation treatment have positional correspondence and are provided to contact with each other, and
   wherein the AB alloy film consists of A and B, where A is a first metal and B is a second metal, the second metal is beryllium, and the AB alloy film subjected to oxidation treatment is located between the first metal A film and a base substrate or between the first metal A film and a semiconductor layer.

9. The array substrate according to claim 8, wherein the first metal A film comprises a gate metal film for forming a gate electrode and a source-drain metal film for forming a source electrode and a drain electrode.

10. The method according to claim 1, wherein a molar content of the second metal B is 1%~3% in an alloy of the first metal A and the second metal B.

11. The method according to claim 1, wherein the first metal A is copper.

12. The method according to claim 4, wherein a molar content of the second metal B is 1%~3% in an alloy of the first metal A and the second metal B.

13. The method according to claim 4, wherein the first metal A is copper.

14. The array substrate according to claim 8, wherein a molar content of the second metal B is 1%~3% in an alloy of the first metal A and the second metal B.

15. The array substrate according to claim 8, wherein the first metal A is copper.

* * * * *